United States Patent
Huang et al.

(10) Patent No.: US 6,699,731 B2
(45) Date of Patent: Mar. 2, 2004

(54) SUBSTRATE OF SEMICONDUCTOR PACKAGE

(75) Inventors: Chien-Ping Huang, Hsinchu (TW); Tzong-Da Ho, Taichung (TW); Chen-Hsu Hsiao, Nantou (TW)

(73) Assignee: Siliconware Precision Industries Co., Ltd. (TW)

( * ) Notice: Subject to any disclaimer, the term of this patent is extended or adjusted under 35 U.S.C. 154(b) by 275 days.

(21) Appl. No.: 09/946,903

(22) Filed: Sep. 5, 2001

(65) Prior Publication Data

US 2002/0137257 A1 Sep. 26, 2002

(30) Foreign Application Priority Data

Feb. 20, 2001 (TW) .......................................... 90103770 A (51) Int. Cl.[7] .......................... H01L 21/44; H01L 21/48; H01L 21/50

(52) U.S. Cl. ........................ 438/108; 438/110; 438/113; 438/118; 438/121; 438/122; 438/124; 438/125; 438/126; 438/127; 438/976

(58) Field of Search ................................. 438/108, 110, 438/113, 118, 121, 122, 976, 124–127

(56) References Cited

U.S. PATENT DOCUMENTS

| 5,450,283 A |   | 9/1995 | Lin et al. |
| 6,093,584 A | * | 7/2000 | Fjelstad ....................... 438/127 |
| 6,117,797 A | * | 9/2000 | Hembree ..................... 438/759 |
| 6,130,116 A | * | 10/2000 | Smith et al. ................. 438/127 |
| 6,309,909 B1 | * | 10/2001 | Ohgiyama ................... 438/112 |
| 6,365,432 B1 | * | 4/2002 | Fukutomi et al. ........... 438/106 |
| 6,444,498 B1 | * | 9/2002 | Huang et al. ................ 438/126 |

* cited by examiner

Primary Examiner—David A. Zameke
(74) Attorney, Agent, or Firm—Peter F. Corless; Steven M. Jensen; Edwards & Angell, LLP (57) ABSTRACT

A fabricating method for a semiconductor package is proposed, in which a chip carrier accommodates at least one semiconductor chip, which is attached with an interface layer formed on a covering module plate consisting of at least one covering plate, while the interface layer is poor in adhesion to the chip and a molding compound used for forming an encapsulant. So that after completing molding, ball implantation and singulation processes, the interface layer, the covering plate and a portion of the encapsulant formed on the covering plate can be easily removed by heating the singulated semiconductor package. This allows the molding compound not to flash on the chip, and prevents the chip from being damaged by stress generated in the molding process.

20 Claims, 11 Drawing Sheets

SUBSTRATE OF SEMICONDUCTOR PACKAGE

FIELD OF THE INVENTION

The present invention relates to fabricating methods for semiconductor packages, and more particularly, to a fabricating method for a semiconductor package, in which a semiconductor chip has a surface exposed to outside of the semiconductor package so as to improve heat dissipating efficiency.

BACKGROUND OF INVENTION

In a semiconductor package, much attention and effort have been directed to effective dissipation of heat generated by a semiconductor chip for assuring the lifetime and quality of the chip.

As an encapsulant for encapsulating the chip is formed of a molding compound such as epoxy resin poor in thermal conductivity, the heat generated by the chip can not be effectively dissipated through the encapsulant. In this case, a heat sink is incorporated in the semiconductor package, wherein the heat sink is made of a metal good in thermal conductivity, in an effort to improve heat dissipating efficiency. However, if the heat sink is entirely embedded in the encapsulant, the heat needs to pass through the encapsulant for dissipation, which therefore restricts the improvement in the heat dissipating efficiency. Therefore, it is desired to construct the semiconductor package in a manner that the chip has a surface exposed to outside of the semiconductor package, so as to allow the heat to be dissipated directly through the exposed surface to the atmosphere.

Accordingly, U.S. Pat. No. 5,450,283 discloses a semiconductor package illustrated in FIG. 5. In the semiconductor package 10, a semiconductor chip 18 has a top surface 22 exposed to outside of an encapsulant 40, for allowing heat generated by the chip 18 to be dissipated directly to the atmosphere without passing through the encapsulant 40. This makes the semiconductor package 10 more improved in heat dissipating efficiency than the foregoing semiconductor package.

Figure 6:
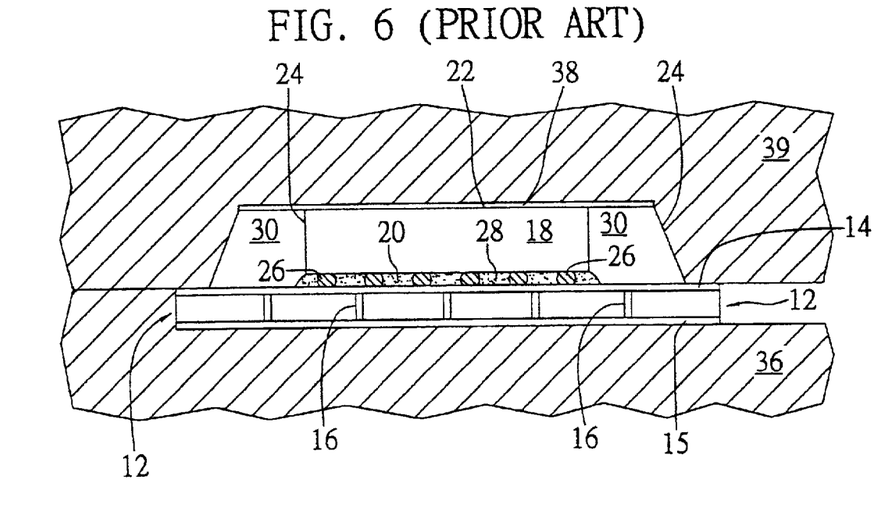
FIG. 6 (PRIOR ART) is a schematic diagram showing a molding process for a conventional semiconductor package having an exposed semiconductor chip.

However, several drawbacks have been found in the fabrication of the semiconductor package 10. First, as shown in FIG. 6, in a molding process for forming the encapsulant 40 by a molding compound, prior to placing the chip 18 associated with a substrate 12 in a molding cavity 30 of a mold, a tape 38 is attached to a top wall of the molding cavity 30, so as to make the top surface 22 of the chip 18 closely abut the top wall of the molding cavity 30 through the tape 38 after an upper mold is engaged with a lower mold of the mold, and to prevent the molding compound from flashing on the top surface 22 of the chip 18. Nevertheless, if the substrate 12 having the chip 18 mounted thereon is overall not sufficiently high, and the top surface 22 of the chip 18 can not closely abut the top wall of the molding cavity 30, a gap is then formed between the chip 18 and the molding cavity 30, and makes the molding compound for forming the encapsulant 40 flash on the top surface 22 of the chip 18. In this case, the semiconductor package 10 can be undesirably affected in heat dissipating efficiency and in profile by the flash of the molding compound on the top surface 22 of the chip 18, and thus a deflash process is required. However, the deflash process is disadvantageous in time-consuming, increasing the fabrication cost and damaging the semiconductor package. Alternatively, if the substrate 12 accommodating the chip 18 overall is excessively high, the chip 18 then abuts the top wall of the mold cavity 30 with such a great force as to make the chip 18 crack.

Moreover, the tape 38 attached to the top wall of the molding cavity 30 is generally made of an expensive heat-resistant material to be remained intact at a high temperature in the molding process, and thus the fabrication cost can not be reduced. Further, the tape 38 is necessarily disposed on the top wall of each molding cavity 30 in a precise and flat manner, this increases the complexity and time expense for the fabrication process, and thus is disadvantageous for reducing the fabrication cost and improving the production efficiency. In addition, the engagement of the upper mold with the lower mold generates a stress, which is transmitted through the tape 38 to the chip 18 and causes cracking damage to the chip 18, so that the semiconductor package can not be improved in quality and the fabrication cost is hard to be reduced.

Figure 5:
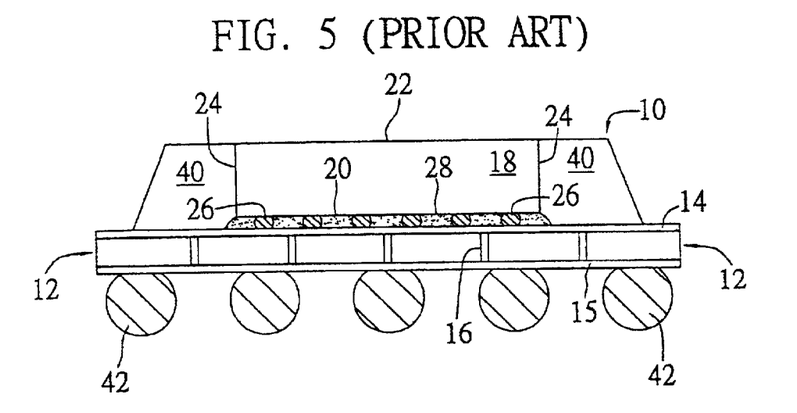
FIG. 5 (PRIOR ART) is a sectional view of a conventional semiconductor package having an exposed semiconductor chip.

Furthermore, in the molding process, the mold employed in the semiconductor package 10 is constructed corresponding in dimension to the package to be fabricated. This therefore increases the fabrication cost and time expense, and reduces the fabrication efficiency.

SUMMARY OF THE INVENTION

A primary objective of the present invention is to provide a fabricating method for a semiconductor package, in which heat generated by a semiconductor chip can be dissipated through an exposed surface of the chip to the atmosphere and flash of a molding compound can be prevented from occurrence, so as to improve heat dissipating efficiency. Further, the fabricating method for a semiconductor package prevents the chip from being damaged in a molding process, and thus assures the quality of the semiconductor package. Moreover, it is not necessary to attach a tape on a top wall of a molding cavity in the molding process, which simplifies the fabricating method and reduces fabrication cost and time expense. Furthermore, in the fabricating method, attachment of the chip to a substrate is not precisely controlled in height, and thus the fabrication cost is reduced and production rate is improved. In addition, a mold used in the fabricating method can be employed for fabricating semiconductor packages various in dimension, so that the fabrication cost is reduced.

In accordance with the foregoing and other objectives, the present invention proposes a fabricating method for a semiconductor package, comprising the steps of:

preparing a chip carrier such as a matrix type substrate module plate, which is consisting of a plurality of substrates;

mounting at least one semiconductor chip on each of the substrates in a manner that a first surface of the chip is attached to a predetermined position on a second surface of the substrate;

preparing a covering module plate consisting of a plurality of covering plates and sufficiently dimensioned for entirely covering all the substrates, and forming an interface layer on a first surface of the covering module plate, wherein the interface layer is poor in adhesion to the chip and a molding compound used for forming an encapsulant, and has the adhesion to the chip and the molding compound smaller than that to the covering module plate;

attaching the interface layer on the covering module plate to all the chips, in a manner that the interface layer formed on a first surface of each of the covering plates is disposed on a second surface opposing the first surface of the chip;

performing a molding process;
performing a ball implantation process;
performing a singulation process; and
heating a singulated semi-fabricated semiconductor package, so as to allow the interface layer to be delaminated from the chip and a portion of an encapsulant formed around the chip, according to a difference in coefficient of thermal expansion between the interface layer and the chip, and the interface layer and the molding compound of the encapsulant. This makes the interface layer, the covering plate and a portion of the encapsulant formed on a second surface of the covering plate easily removed from the second surface of the chip and the portion of the encapsulant formed around the chip.

Combined structure of the covering module plate and the chips is lower in height than a molding cavity of a mold used in the molding process, that is, the molding compound encapsulates the second surface of the covering module plate during molding. However, the interface layer, the covering plate and the molding compound formed on the second surface of the covering plate can be easily removed by heating the singulated seim-fabricated semiconductor package, since the interface layer has adhesion to the chip and the molding compound smaller than that to the covering module plate.

Moreover, an exposed surface of the chip does not abut a top wall of the molding cavity, so that it is not necessary to dispose a tape on the top wall, and thus the fabricating method can be simplified and the chip can be prevented from being damaged during molding.

Furthermore, due to flexibility in height for combined structure of the covering module plate, the chips and the substrate module plate, and also due to free adjustment in quantity and arrangement for the substrates on the chip carrier corresponding in dimension to chips or semiconductor packages, the mold used in the molding process can be employed for fabricating the semiconductor packages various in dimension.

The covering module plate is made of a metallic material such as copper, aluminum, copper alloy or aluminum alloy, or a substrate consisting of a tape or BT (bismaleimide triazine) resin having surfaces thereof each covered with a foil or layer formed of a metallic material such as copper, aluminum, copper alloy or aluminum alloy. The interface layer on the covering module plate is made of an adhesive poor in adhesion to the chips and the molding compound, epoxy resin, a metallic material such as gold, chromium, nickel or alloy thereof, or Teflon, so as to allow the interface layer have the adhesion to the molding compound and the chips smaller than that to the covering module plate. In this case, the interface layer, the covering plate and the molding compound formed on the second surface of the covering plate can be easily removed from the second surface of the chip and the portion of the encapsulant formed around the chip.

In a preferred embodiment of the invention, the chip carrier consists of at least one BGA (ball grid array) substrate, while the substrate is formed with a hole for allowing bonding wires to pass therethrough and to electrically connect the substrate to a semiconductor chip. On a first surface of the substrate there are implanted a plurality of solder balls for electrically connecting the chip to external devices.

In another preferred embodiment of the invention, the chip carrier consists of at least one flip-chip substrate, that is, a second surface of the substrate has a plurality of array-arranged bumps pads, which are used to bond a plurality of solder bumps thereon for electrically connecting a semiconductor chip to the substrate through the solder bumps. Moreover, a first surface of the substrate is implanted with a plurality of solder balls for electrically connecting the chip to external devices.

In addition, in order to enhance the adhesion of the chip to the encapsulant, side surfaces of the chip can be roughed, corrugated or made uneven by using a conventional process.

BRIEF DESCRIPTION OF THE DRAWINGS

The present invention can be more fully understood by reading the following detailed description of the preferred embodiments, with reference made to the accompanying drawings wherein.

DETAILED DESCRIPTION OF THE PREFERRED EMBODIMENT

First Preferred Embodiment

Figure 1A:
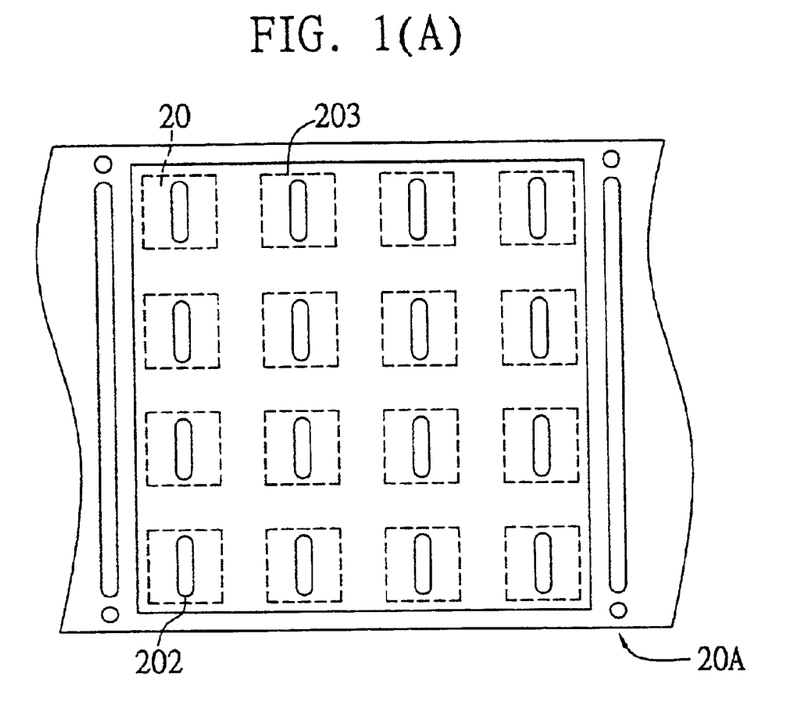
FIGS. 1(A)–1(H) are schematic diagrams showing the steps involved in performing a first preferred embodiment of the fabricating method for a semiconductor package of the invention.

A first embodiment of the fabricating method for a semiconductor package of the invention is fully described with reference to FIGS. 1(A)–1(H). Referring first to FIG. 1(A), a matrix type BGA substrate module plate 20A is prepared, consisting of sixteen substrates 20 arranged in 4×4 array, while the substrates 20 each is formed with a hole 202 penetrating the substrate 20.

Figure 1B:
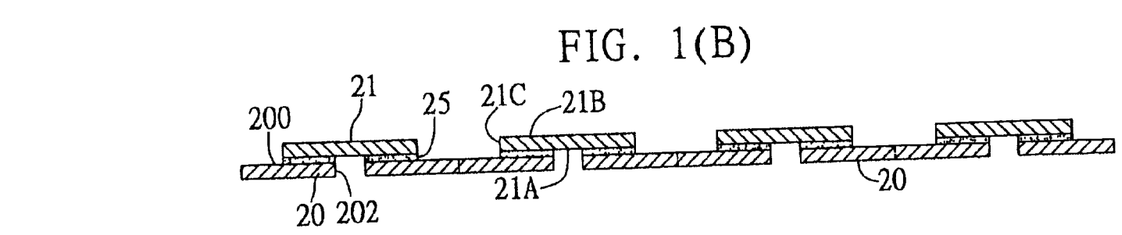

Referring next to FIG. 1(B), at a predetermined position on a second surface 200 of each of the substrates 20 there is attached a semiconductor chip 21 by an adhesive 25, in a manner that the chip 21 covers one end of the hole 202.

Figure 1C:
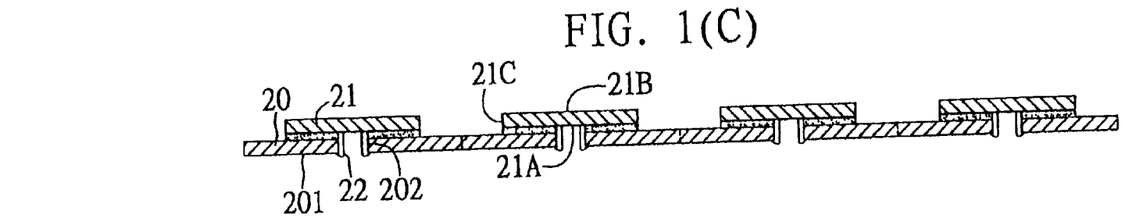

Referring further to FIG. 1(C), a wire bonding process is performed for bonding a plurality of bonding wires 22 such as gold wires through the hole 202 to the chip 21 and a first surface of the substrate 20 respectively so as to electrically connect the chip 21 to the substrate 20. Since the wire bonding process is a conventional technology, it will not be further described herein.

Figure 1D:
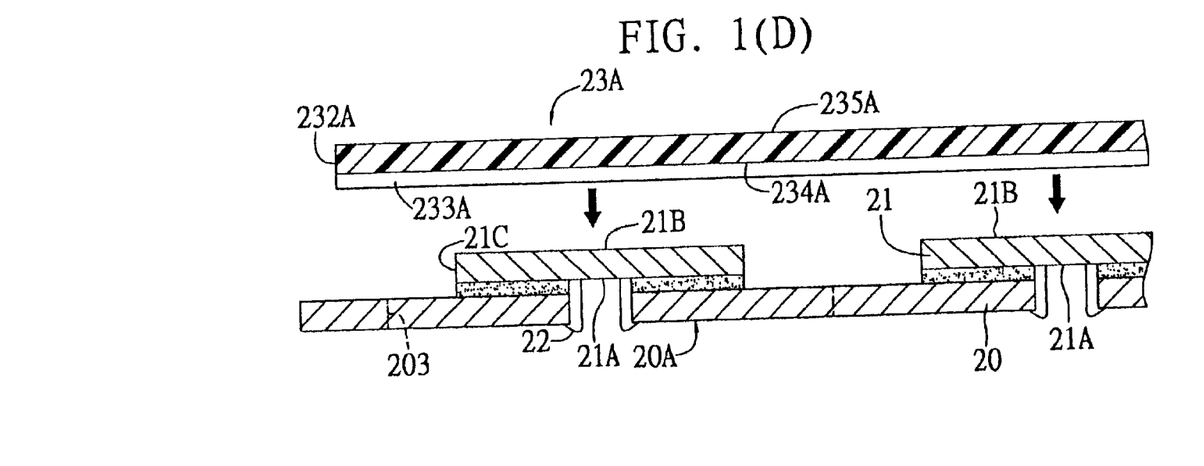

Referring to FIG. 1(D), after the chip 21 is electrically connected to the substrate 20, a covering module plate 23A is used to cover all the chips 21 in a manner that an interface layer 233A formed on a first surface 234A of the covering module plate 23A is attached to a second surface 21B opposing a first surface 21A of each of the chips 21. The covering module plate 23A is made of a metallic material such as copper, aluminum copper alloy or aluminum alloy, or a substrate consisting of a tape or BT resin having surfaces thereof each covered with a foil or layer formed of a metallic material such as copper, aluminum, copper alloy or aluminum alloy. The interface layer 233A is poor in adhesion to the chips 21 and a molding compound used for forming an encapsulant.

The covering module plate 23A is sufficiently dimensioned for covering all the substrates 20, that is, side edges 232A of the covering module plate 23A is more outwardly positioned than side edges 203 (illustrated as dotted lines in FIG. 1(A)) of the substrates 20 located in proximity to edges of the substrate module plate 20A. As combined structure of the covering module plate 23A, the chips 21 and the substrate module plate 20A is placed in a molding cavity of a mold (not shown), a second surface 235A of the covering module plate 23A is properly spaced from a top wall of the molding cavity without abutting the top wall. The interface layer 233A on the covering module plate 23A is made of an adhesive poor in adhesion to the chips 21 and the molding compound, epoxy resin, a metallic material such as gold, chromium, nickel or alloy thereof, or Teflon, so as to allow the interface layer 233A have the adhesion to the molding compound and the chips 21 smaller than that to the covering module plate 23A.

Figure 1E:
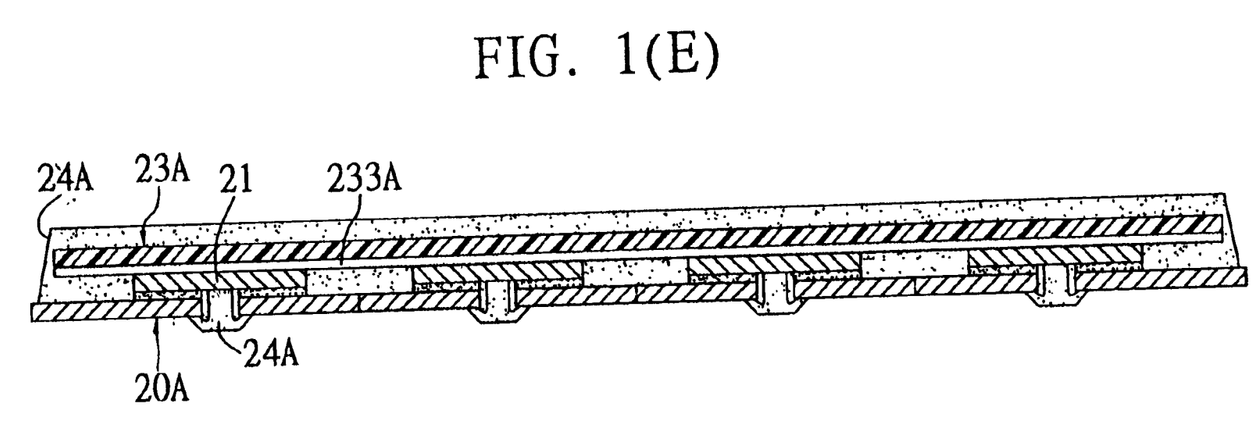

Referring to FIG. 1(E), the combined structure of the covering module plate 23A, the chips 21 and the substrate module plate 20A is placed in the molding cavity of the mold for performing a molding process. The molding compound is injected to the molding cavity so as to form the encapsulant 24A for encapsulating the covering module plate 23A, the chips 21, the gold wires 22 and the holes 202. As the covering module plate 23A of the combined structure is properly spaced from the top wall of the molding cavity, after an upper mold of the mold is engaged with a lower mold, the chips 21 do not suffer stress from the mold and the covering module plate 23A, and thus can be prevented from being damaged. Further, since the attachment of the substrate module plate 20A to the chips 21 needs not to be precisely controlled in height, the quality and reliability of the semiconductor package can be assured.

Figure 1F:
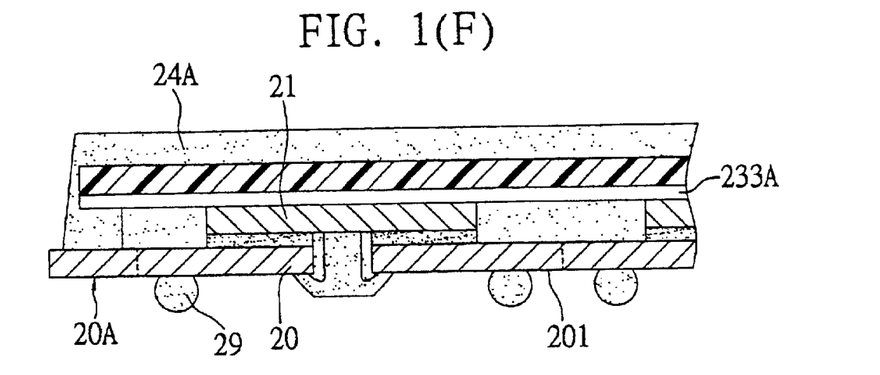

Referring to FIG. 1(F), after the molding process is completed, on the first surface 201 of each of the substrates 20 there are implanted a plurality of solder balls 29 for electrically connecting the chip 21 to external devices. Since the implantation for the solder balls 29 employs a conventional technology, it will not be further described herein.

Figure 1G:
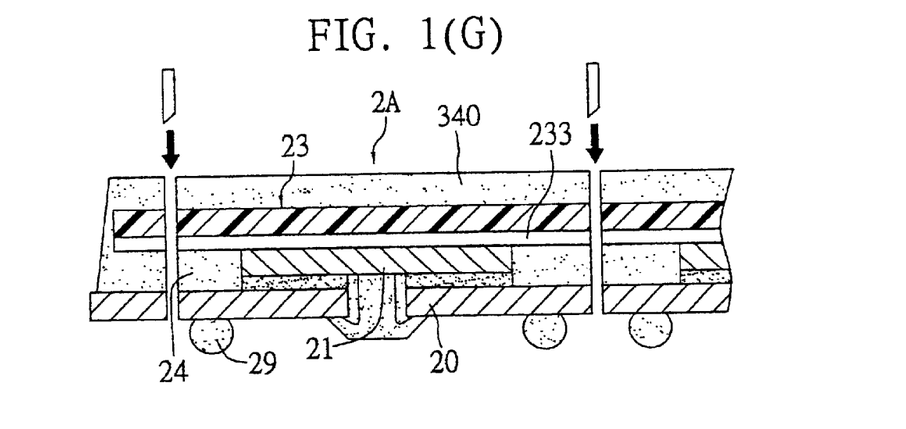

Referring to FIG. 1(G), a singulation process is performed by using a cutting means so as to form sixteen individual semi-fabricated semiconductor packages 2A.

Figure 1H:
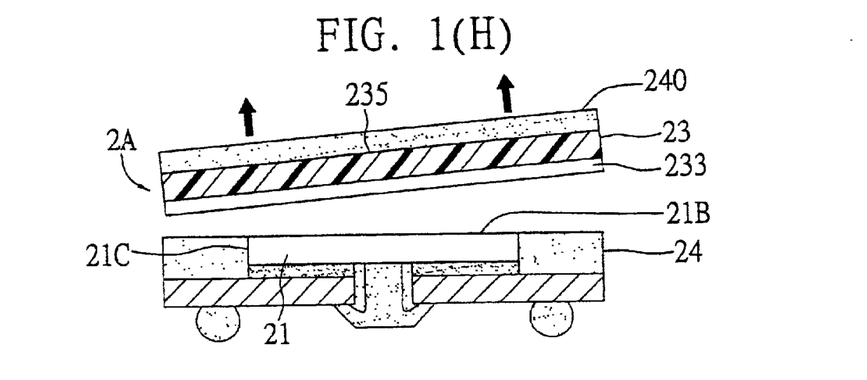

Referring finally to FIG. 1(H), each of the singulated semi-fabricated semiconductor packages 2A is heated, for allowing an interface layer 233 (formed by singulating the interface layer 233A) to be delaminated from the chip 21 and a portion of an encapsulant 24 (formed by singulating the encapsulant 24A) formed around the chip 21, according to a difference in coefficient of thermal expansion between the interface layer 233 and the chip 21, and the interface layer 233 and the molding compound of the encapsulant 24. This makes the interface layer 233, a covering plate 23 (formed by singulating the covering module plate 23A) and a portion 240 of the encapsulant 24 formed on a second surface 235 of the covering plate 23 easily removed from the second surface 21B of the chip 21 and the portion of the encapsulant 24 formed around the chip 21. In this case, the second surface 21B of the chip 21 is exposed to outside of the encapsulant 24, so that heat generated by the chip 21 can be directly dissipated through the exposed second surface 21B to the atmosphere. Moreover, in the molding process, as the second surface 21B of the chip 21 is entirely covered by the interface layer 233, no molding compound flashes on the second surface, and thus no deflash process is needed, so that the fabrication cost can be reduced and the semiconductor package is well maintained in profile.

Furthermore, due to flexibility in height for the combined structure of the covering module plate 23A, the chips 21 and the substrate module plate 20A, and also due to free adjustment in quantity and arrangement for the substrates on the substrate module plate 20A corresponding in dimension to chips or semiconductor packages, the mold used in the molding process can be employed for fabricating the semiconductor packages various in dimension, and thus the fabrication cost can be reduced.

In addition, side surfaces 21C of the chip 21 can be optionally roughed, corrugated or made uneven by using a conventional process, so as to enhance the adhesion of the chip 21 to the encapsulant 24.

Second Preferred Embodiment

Figure 2A:
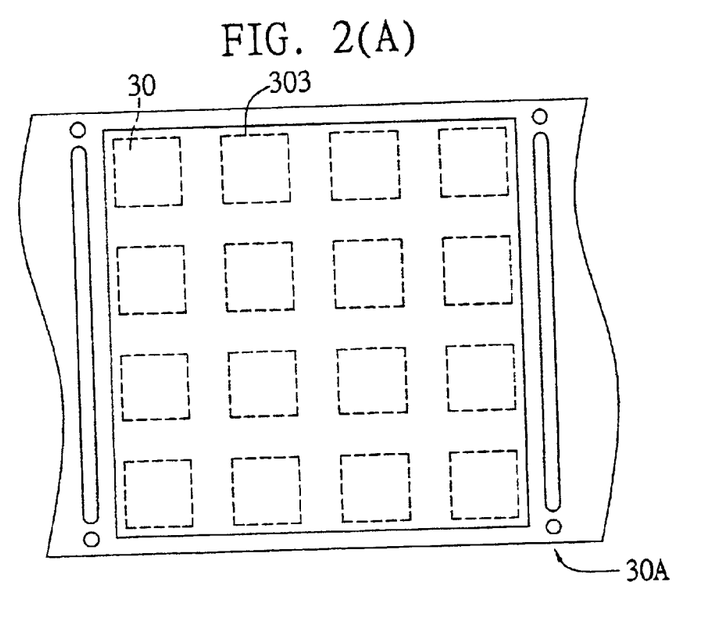
FIGS. 2(A)–2(H) are schematic diagrams showing the steps involved in performing a second preferred embodiment of the fabricating method for a semiconductor package of the invention.

A second embodiment of the fabricating method for a semiconductor package of the invention is fully described with reference to FIGS. 2(A)–2(H). Referring first to FIG. 2(A), a matrix type flip-chip substrate module plate 30A is prepared, consisting of sixteen substrates 30 arranged in 4×4 array.

Figure 2B:
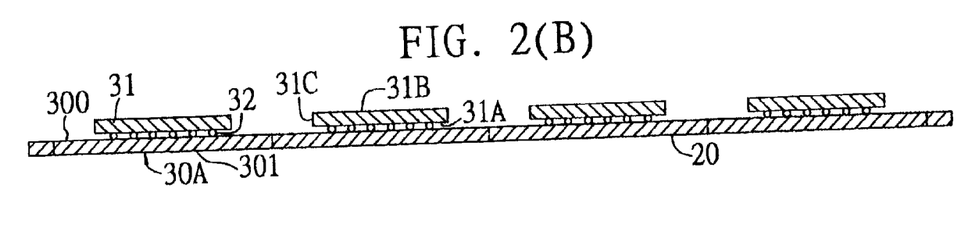

Referring next to FIG. 2(B), a plurality of bump pads are formed at predetermined positions on a second surface 300 of each of the substrates 30, while a plurality of conductive traces (not shown) are formed on the second surface 300 and a first surface 301 opposing the second surface 300, respectively. Then, a plurality of solder bumps 32 are boned to the bump pads, for allowing a semiconductor chip 31 to be electrically connected to the substrate 30 through the solder bumps 32 in a flip chip manner.

Figure 2C:
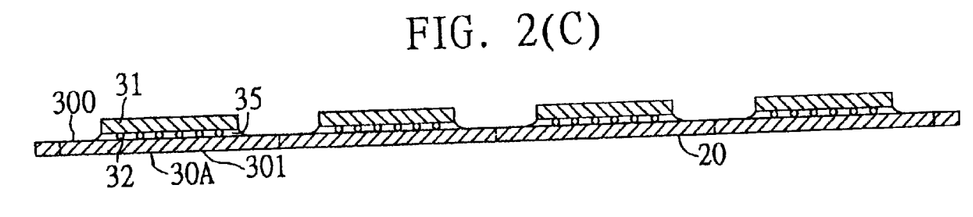

Referring further to FIG. 2(C), an underfilling process is performed for filling a gap between a first surface 31A of the chip 31 and the second surface 300 of the substrate 30 with an insulative material 35 such as epoxy resin, so as to protect the electrical connection of the chip 31 to the substrate 30. Since the underfilling process is a conventional technology, it will not further described herein.

Figure 2D:
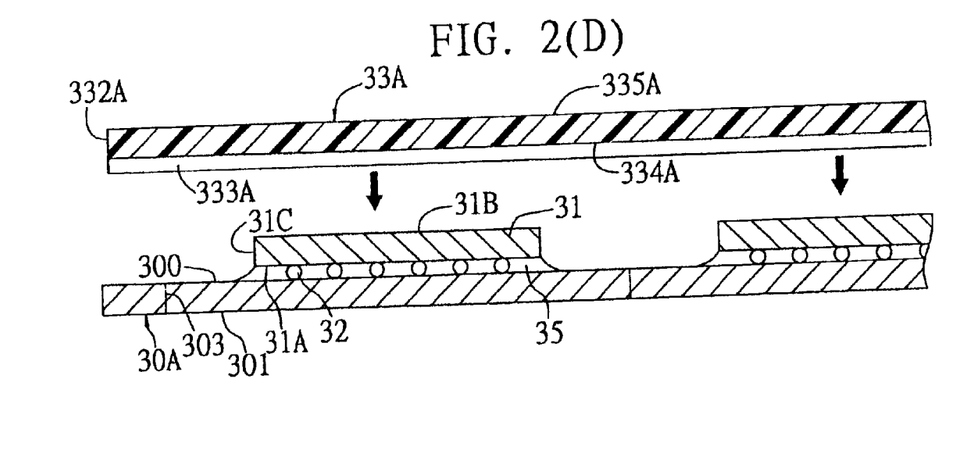

Referring to FIG. 2(D), after the chip 31 is electrically connected to the substrate 30, a covering module plate 33A is used to cover all the chips 31 in a manner that an interface layer 333A formed on a first surface 334A of the covering module plate 33A is attached to a second surface 31B opposing the first surface 31A of each of the chips 31. The covering module plate 33A is made of a metallic material such as copper, aluminum, copper alloy or aluminum alloy, or a substrate consisting of a tape or BT resin having surfaces thereof each covered with a foil or layer formed of a metallic material such as copper, aluminum, copper alloy or aluminum alloy. The interface layer 333A is poor in adhesion to the chips 31 and a molding compound used for forming an encapsulant.

The covering module plate 33A is sufficiently dimensioned for covering all the substrates 30, that is, side edges 332A of the covering module plate 33A is more outwardly positioned than side edges 303 (illustrated as dotted lines in FIG. 2(A)) of the substrates 30 located in proximity to edges of the substrate module plate 30A. As combined structure of the covering module plate 33A, the chips 31 and the substrate module plate 30A is placed in a molding cavity of a mold (not shown), a second surface 335A of the covering module plate 33A is properly spaced from a top wall of the molding cavity without abutting the top wall. The interface layer 333A on the covering module plate 33A is made of an adhesive poor in adhesion to the chips 31 and the molding compound, epoxy resin, a metallic material such as gold, chromium, nickel or alloy thereof, or Teflon, so as to allow the interface layer 333A have the adhesion to the molding compound and the chips 31 smaller than that to the covering module plate 33A.

Figure 2E:
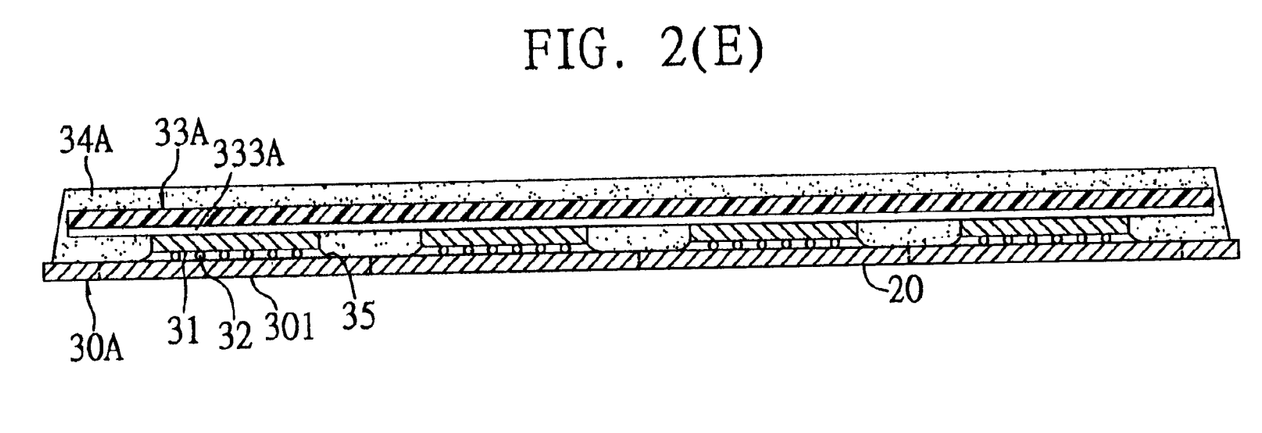

Referring to FIG. 2(E), the combined structure of the covering module plate 33A, the chips 31 and the substrate module plate 30A is placed in the molding cavity of the mold for performing a molding process. The molding compound is injected to the molding cavity so as to form the encapsulant 34A for encapsulating the covering module plate 33A, the chips 31 and the insulative material 35. As the covering module plate 33A of the combined structure is properly spaced from the top wall of the molding cavity, after an upper mold of the mold is engaged with a lower mold, the chips 31 do not suffer stress from the mold and the covering module plate 33A, and thus can be prevented from being damaged. Further, since the attachment of the substrate module plate 30A to the chips 31 needs not to be precisely controlled in height, the quality and reliability of the semiconductor package can be assured.

Figure 2F:
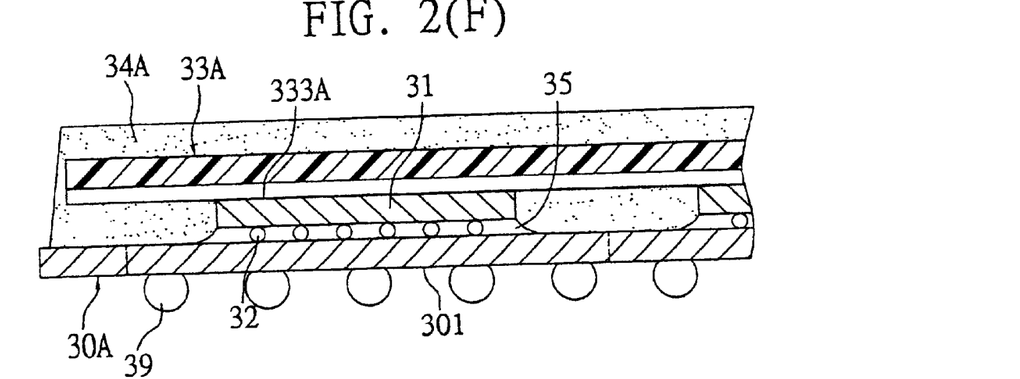

Referring to FIG. 2(F), after the molding process is completed, on the first surface 301 of each of the substrates 30 there are implanted a plurality of solder balls 39 for electrically connecting the chip 31 to external devices. Since the implantation for the solder balls 39 employs a conventional technology, it will not be further described herein.

Figure 2G:
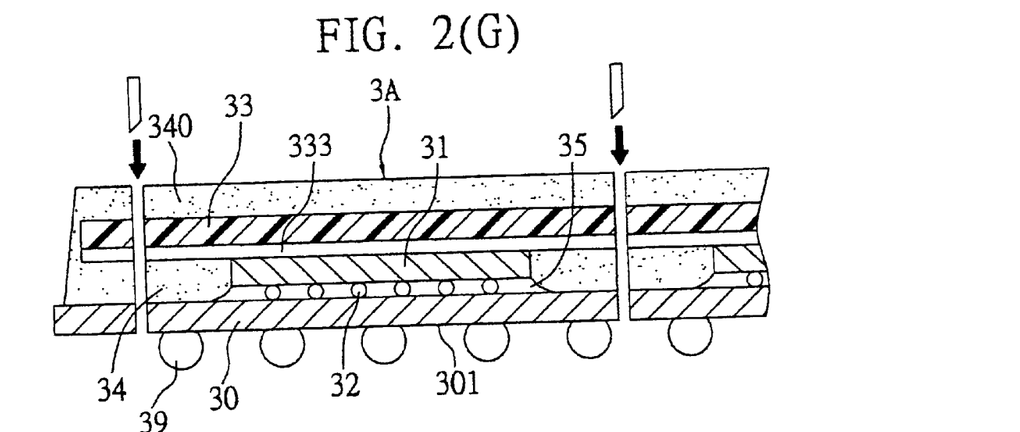

Referring to FIG. 2(G), a singulation process is performed by using a cutting means so as to form sixteen individual semi-fabricated semiconductor packages 3A.

Figure 2H:
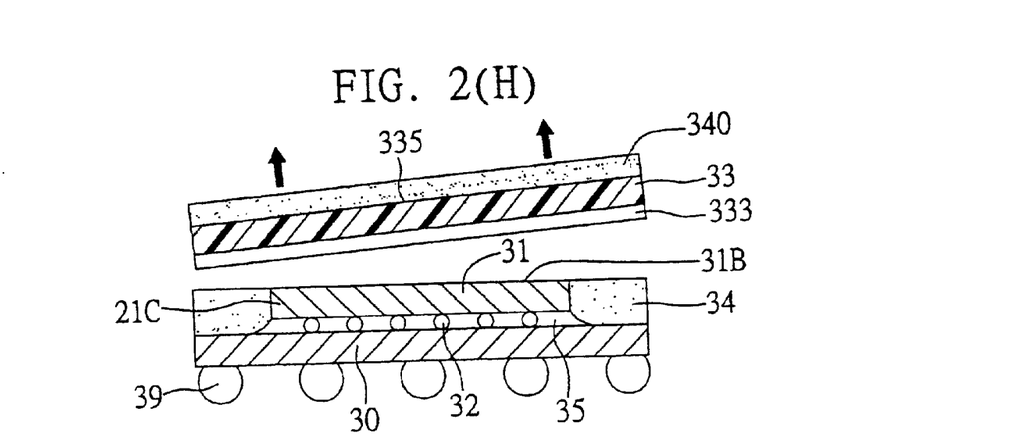

Referring finally to FIG. 2(H), each of the singulated semi-fabricated semiconductor packages 3A is heated, for allowing an interface layer 333 (formed by singulating the interface layer 333A) to be delaminated from the chip 31 and a portion of an encapsulant 34 (formed by singulating the encapsulant 34A) formed around the chip 31, according to a difference in coefficient of thermal expansion between the interface layer 333 and the chip 31, and the interface layer 333 and the molding compound of the encapsulant 34. This makes the interface layer 333, a covering plate 33 (formed by singulating the covering module plate 33A) and a portion 340 of the encapsulant 34 formed on a second surface 335 of the covering plate 33 easily removed from the second surface 31B of the chip 31 and the portion of the encapsulant 34 formed around the chip 31. In this case, the second surface 31B of the chip 31 is exposed to outside of the encapsulant 34, so that heat generated by the chip 31 can be directly dissipated through the exposed second surface 31B to the atmosphere. Moreover, in the molding process, as the second surface 31B of the chip 31 is entirely covered by the interface layer 333, no molding compound flashes on the second surface, and thus no deflash process is needed, so that the fabrication cost can be reduced and the semiconductor package is well maintained in profile.

Furthermore, due to flexibility in height for the combined structure of the covering module plate 33A, the chips 31 and the substrate module plate 30A, and also due to free adjustment in quantity and arrangement for the substrates on the substrate module plate 30A corresponding in dimension to chips or semiconductor packages, the mold used in the molding process can be employed for fabricating the semiconductor packages various in dimension, and thus the fabrication cost can be reduced.

In addition, side surfaces 31C of the chip 31 can be optionally roughed, corrugated or made uneven by using a conventional process, so as to enhance the adhesion of the chip 31 to the encapsulant 34.

Third Preferred Embodiment

Figure 3:
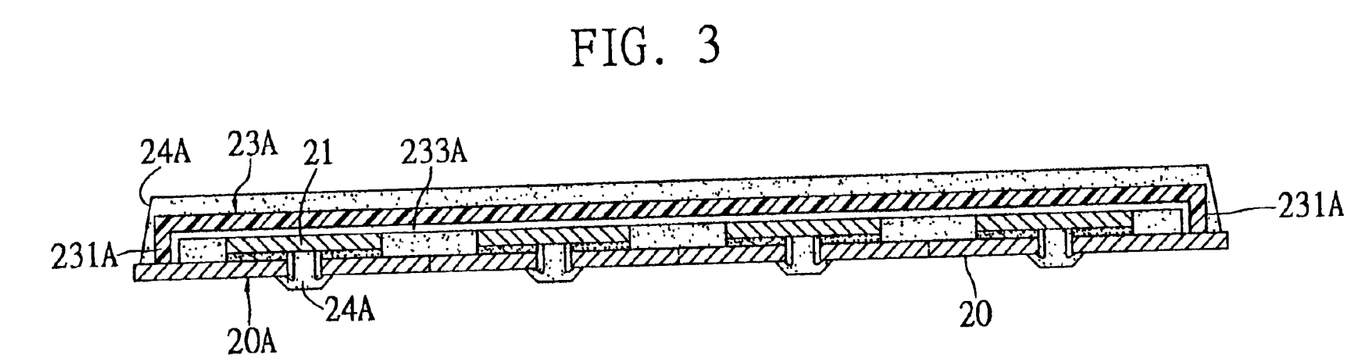
FIG. 3 is a schematic diagram showing the completion of a molding process in a third preferred embodiment of the fabricating method for a semiconductor package of the invention.

As shown in FIG. 3, at side edges of the covering module plate 23A in the first embodiment of the invention there can also be optionally formed with a connecting portion 231A, which is attached to the substrate module plate 20A by means of a conventional technology such as an adhesive (or a tape), so as to enhance the attachment of the covering module plate 23A to the chips 21.

Fourth Preferred Embodiment

Figure 4:
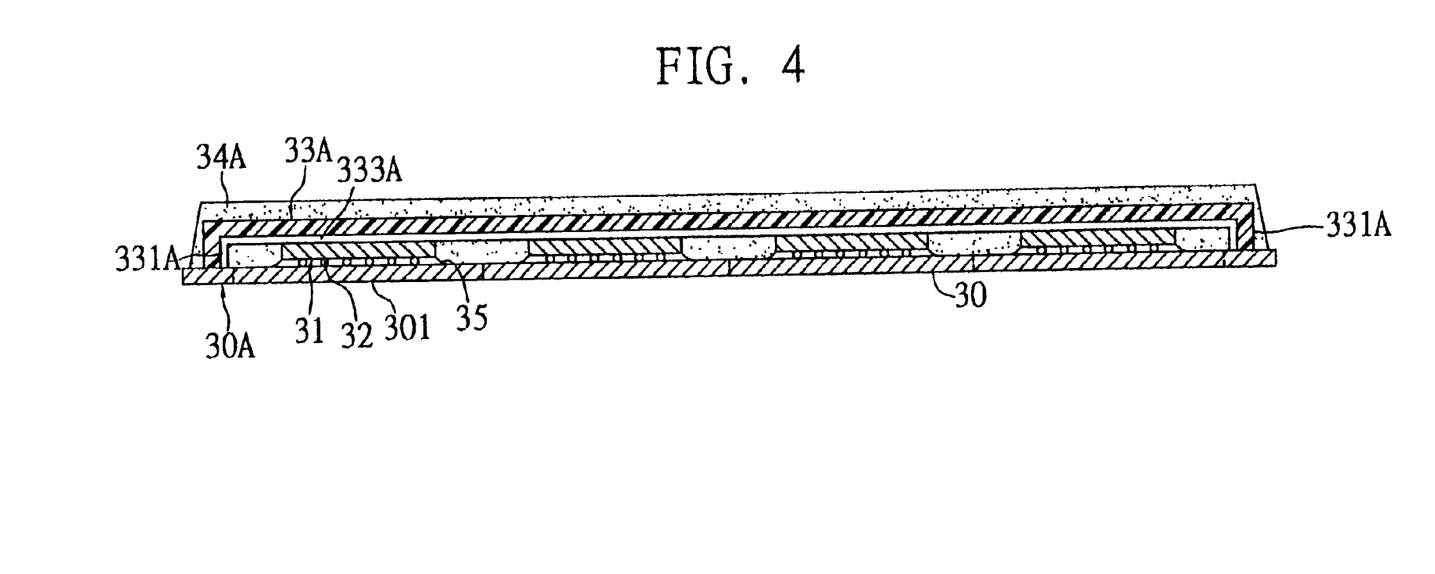
FIG. 4 is a schematic diagram showing the completion of a molding process in a fourth preferred embodiment of the fabricating method for a semiconductor package of the invention.

As shown in FIG. 4, at side edges of the covering module plate 33A in the second embodiment of the invention there can also be optionally formed with a connecting portion 331A, which is attached to the substrate module plate 30A by means of a conventional technology such as an adhesive (or a tape), so as to enhance the attachment of the covering module plate 33A to the chips 31.

In the foregoing embodiments of the invention, the first surface of the covering module plate can be optionally roughed, corrugated or made uneven by using a conventional process, and then formed with the interface layer thereon poor in adhesion to the molding compound of the encapsulant and the chips. This is to enhance the attachment of the covering module plate to the interface layer, and to assure that the interface layer has the adhesion to the molding compound and the chips smaller than that to the covering module plate.

The invention has been described using exemplary preferred embodiments. However, it is to be understood that the scope of the invention is not limited to the disclosed embodiments. On the contrary, it is intended to cover various modifications and similar arrangements. For example, besides the side edges, the connecting portion can be alternatively formed at other positions on the covering module plate, such as a position between two neighboring chips. The scope of the claims, therefore, should be accorded the broadest interpretation so as to encompass all such modifications and similar arrangements.

What is claimed is:

1. A fabricating method for a semiconductor package, comprising the steps of:

preparing a chip carrier;

mounting at least one semiconductor chip on the chip carrier in a manner that a first surface of the chip is attached to a predetermined position on a second surface of the chip carrier;

preparing a covering module plate consisting of at least one covering plate and sufficiently dimensioned for entirely covering the chip carrier, and forming an interface layer on a first surface of the covering module plate, wherein the interface layer is poor in adhesion to the chip and a molding compound used for forming an encapsulant, and has the adhesion to the chip and the molding compound smaller than that to the covering module plate;

attaching the interface layer on the first surface of the covering module plate to a second surface opposing the first surface of the chip;

performing a molding process;

performing a ball implantation process;

performing a singulation process;

heating a singulated semi-fabricated semiconductor package; and removing the interface layer, the covering plate and a portion of the encapsulant formed on a second surface of the covering plate from the second surface of the chip and a portion of the encapsulant formed around the chip.

2. The fabricating method of claim 1, wherein the interface layer is made of a material selected from a group consisting of an adhesive, epoxy resin, gold, chromium, nickel, alloy thereof and Teflon.

3. The fabricating method of claim 1, wherein the covering module plate made of a material selected from a group consisting of copper, aluminum, alloy thereof, and a substrate consisting of a tape or BT (bismaleimide triazine) resin having surfaces thereof each covered with a foil formed of copper, aluminum or alloy thereof.

4. The fabricating method of claim 1, wherein the chip is electrically connected to the chip carrier by bonding a plurality of bonding wires from the first surface of the chip through a hole formed on the chip carrier to a first surface opposing the second surface of he chip carrier.

5. The fabricating method of claim 1, wherein the first surface of the chip is electrically connected to the second surface of the chip carrier in a flip chip manner.

6. The fabricating method of claim 1, wherein side surfaces of the chip are roughed, corrugated or made uneven.

7. The fabricating method of claim 1, wherein the first surface of the covering module plate is further formed with a connecting portion thereon, which is attached to the chip carrier.

8. The fabricating method of claim 1, wherein the first surface of the covering module plate is roughed, corrugated or made uneven.

9. A fabricating method for a semiconductor package, comprising the steps of:
preparing a substrate module plate formed with at least one hole;
mounting at least one semiconductor chip on the substrate module plate in a manner that a first surface of the chip is attached to a predetermined position on a second surface of the substrate module plate;
bonding a plurality of bonding wires from the first surface of the chip through the hole of the substrate module plate to a first surface opposing the second surface of substrate module plate, for electrically connecting the chip to the substrate module plate;
preparing a covering module plate consisting of at least one covering plate and sufficiently dimensioned for entirely covering the substrate module plate, and forming an interface layer on a first surface of the covering module plate, wherein the interface layer is poor in adhesion to the chip and a molding compound used for forming an encapsulant, and has the adhesion to the chip and the molding compound smaller than that to the covering module plate;
attaching the interface layer on the first surface of the covering module plate to a second surface opposing the first surface of the chip;
performing a molding process;
performing a ball implantation process;
performing a singulation process;
heating a singulated semi-fabricated semiconductor package; and
removing the interface layer, the covering plate and a portion of the encapsulant formed on a second surface of the covering plate from the second surface of the chip and a portion of the encapsulant formed around the chip.

10. The fabricating method of claim 9, wherein the interface layer is made of a material selected from a group consisting of an adhesive, epoxy resin, gold, chromium, nickel, alloy thereof and Teflon.

11. The fabricating method of claim 9, wherein the covering module plate made of a material selected from a group consisting of copper, aluminum, alloy thereof, and a substrate consisting of a tape or BT (bismaleimide triazine) resin having surfaces thereof each covered with a foil formed of copper, aluminum or alloy thereof.

12. The fabricating method of claim 9, wherein side surfaces of the chip are roughed, corrugated or made uneven.

13. The fabricating method of claim 9, wherein the first surface of the covering module plate is further formed with a connecting portion thereon, which is attached to the chip carrier.

14. The fabricating method of claim 9, wherein the first surface of the covering module plate is roughed, corrugated or made uneven.

15. A fabricating method for a semiconductor package, comprising the steps of:
preparing a flip-chip substrate module plate;
mounting at least one semiconductor chip on the substrate module plate in a manner that a first surface of the chip is attached to a predetermined position on a second surface of the substrate module plate;
filling a gap between the first surface of the chip and the second surface of the substrate module plate with an insulative material;
preparing a covering module plate consisting of at least one covering plate and sufficiently dimensioned for entirely covering the substrate module plate, and forming an interface layer on a first surface of the covering module plate, wherein the interface layer is poor in adhesion to the chip and a molding compound used for forming an encapsulant, and has the adhesion to the chip and the molding compound smaller than that to the covering module plate;
attaching the interface layer on the first surface of the covering module plate to a second surface opposing the first surface of the chip;
performing a molding process;
performing a ball implantation process;
performing a singulation process;
heating a singulated semi-fabricated semiconductor package; and
removing the interface layer, the covering plate and a portion of the encapsulant formed on a second surface of the covering plate from the second surface of the chip and a portion of the encapsulant formed around the chip.

16. The fabricating method of claim 15, wherein the interface layer is made of a material selected from a group consisting of an adhesive, epoxy resin, gold, chromium, nickel, alloy thereof and Teflon.

17. The fabricating method of claim 15, wherein the covering module plate made of a material selected from a group consisting of copper, aluminum, alloy thereof, and a substrate consisting of a tape or BT (bismaleimide triazine) resin having surfaces thereof each covered with a foil formed of copper, aluminum or alloy thereof.

18. The fabricating method of claim 15, wherein side surfaces of the chip are roughed, corrugated or made uneven.

19. The fabricating method of claim 15, wherein the first surface of the covering module plate is further formed with a connecting portion thereon, which is attached to the chip carrier.

20. The fabricating method of claim 15, wherein the first surface of the covering module plate is roughed, corrugated or made uneven.

* * * * *